United States Patent
Blodt

(10) Patent No.: US 9,882,545 B2
(45) Date of Patent: Jan. 30, 2018

(54) METHOD FOR OPTIMIZING THE IMPEDANCE OF A CONNECTING ELEMENT

(71) Applicant: Endress + Hauser GmbH + Co. KG, Maulburg (DE)

(72) Inventor: Thomas Blodt, Basel (CH)

(73) Assignee: Endress + Hauser GmbH + Co. KG, Maulburg (DE)

( * ) Notice: Subject to any disclaimer, the term of this patent is extended or adjusted under 35 U.S.C. 154(b) by 137 days.

(21) Appl. No.: 14/915,298

(22) PCT Filed: Jul. 8, 2014

(86) PCT No.: PCT/EP2014/064600
§ 371 (c)(1),
(2) Date: Feb. 29, 2016

(87) PCT Pub. No.: WO2015/028181
PCT Pub. Date: Mar. 5, 2015

(65) Prior Publication Data
US 2016/0218692 A1    Jul. 28, 2016

(30) Foreign Application Priority Data

Aug. 30, 2013  (DE) .................. 10 2013 109 463

(51) Int. Cl.
H03H 7/38 (2006.01)
H03H 7/40 (2006.01)

(52) U.S. Cl.
CPC ............... *H03H 7/38* (2013.01); *H03H 7/40* (2013.01); *H03H 2260/00* (2013.01)

(58) Field of Classification Search
CPC .................................. H03H 7/38; H03H 7/40
(Continued)

(56) References Cited

U.S. PATENT DOCUMENTS

| | | |
|---|---|---|
| 6,812,794 B1 | 11/2004 | Mori et al. |
| 7,991,363 B2 | 8/2011 | Greene |

(Continued)

FOREIGN PATENT DOCUMENTS

| | | |
|---|---|---|
| CN | 101573881 A | 11/2009 |
| DE | 102004030106 A1 | 1/2006 |

(Continued)

OTHER PUBLICATIONS

English Translation of International Preliminary Report on Patentability, WIPO, Geneva, dated Mar. 10, 2016.

(Continued)

*Primary Examiner* — Stephen E Jones
(74) *Attorney, Agent, or Firm* — Bacon & Thomas, PLLC

(57) ABSTRACT

A method for optimizing impedance of a connecting element between a first component and a second component of a high-frequency apparatus. The first component and the second component have at least two level states, wherein the connecting element has an input impedance and an output impedance. The first component has respective impedances in each of the at least two level states, wherein the second component has respective impedances in each of the at least two level states. The method comprising the steps as follows: determining a respective magnitude of a difference of the first component between the complex conjugated input impedance and a respective impedance of the first component, determining a respective magnitude of a difference of the second component between the complex conjugated output impedance and a respective impedance of the second component, and simultaneously minimizing the respective magnitudes of the first component and second component relative to the in- and output impedances of the connecting element.

8 Claims, 4 Drawing Sheets

(58) Field of Classification Search
USPC .................................................. 333/32, 17.3
See application file for complete search history.

(56) References Cited

U.S. PATENT DOCUMENTS

| 8,441,326 | B1 | 5/2013 | Bromberger |
| 2014/0038662 | A1* | 2/2014 | Alberth, Jr. ............... H01P 1/18 |
| | | | 455/550.1 |
| 2016/0020814 | A1* | 1/2016 | Wang ....................... H03H 7/38 |
| | | | 455/77 |

FOREIGN PATENT DOCUMENTS

| EP | 1168604 A1 | 1/2002 |
| WO | 2009064968 A1 | 5/2009 |
| WO | 2011134635 A1 | 11/2011 |

OTHER PUBLICATIONS

International Search Report,, EPO, The Netherlands, dated Oct. 7, 2014.
German Search Report, German PTO, Munich, dated Mar. 17, 2014.
"Broadband Impedance Matching Methods," Thomas R. Cuthbert, Jr., Primedia Magazines & Media, Overland Park, Kansas, vol. 17, No. 8, Aug. 1, 1994, pp. 64, 66-71.
"Power Waves and Copjugate Matching," Jussi Rahola, IEEE Transactions on Circuits and Systems II: Express Briefs, IEEE US vol. 55, No. 1, Jan. 2008, pp. 92-96.
"Halbleiter-Schaltungstechnik," Ulrich Tuetze et al., Auflage Berlin Heidelberg, Springer Vieweg, 2012, pp. 1-4.

* cited by examiner

METHOD FOR OPTIMIZING THE IMPEDANCE OF A CONNECTING ELEMENT

TECHNICAL FIELD

The invention relates to a method for optimizing the impedance of a connecting element between two components of a high-frequency apparatus, respectively a field device.

BACKGROUND DISCUSSION

Often applied in automation technology, especially in process automation technology, are field devices, which serve for registering and/or influencing process variables. A field device, is, in such case, especially selected from a group composed of flow measuring devices, fill level measuring devices, pressure measuring devices, temperature measuring devices, limit level measuring devices and/or analytical measuring devices.

Flow measuring devices include especially Coriolis-, ultrasonic-, vortex-, thermal and/or magneto inductive, flow measuring devices. Fill level measuring devices include especially microwave fill level measuring devices, ultrasonic fill level measuring devices, time domain reflectometric fill level measuring devices (TDR), radiometric fill level measuring devices, capacitive fill level measuring devices, inductive fill level measuring devices and/or temperature sensitive fill level measuring devices. Pressure measuring devices include especially absolute-, relative- or difference pressure measuring devices. Temperature measuring devices include especially measuring devices with thermocouples and temperature dependent resistors. Limit level measuring devices include especially vibronic, ultrasonic, limit level measuring devices and/or capacitive limit level measuring devices. Analytical measuring devices include especially pH-sensors, conductivity sensors, oxygen- and hydrogen peroxide sensors, (spectro-)photometric sensors, and/or ion-selective electrodes.

A large number of such field devices are produced and sold by the firm, Endress+Hauser.

High-frequency apparatuses, such as, for example, field devices, are composed of a number of components, which work with an operating frequency or with fractions of the operating frequency. For example, the radar based Micropilot ES FMR50 fill-level measuring device of the company Endress+Hauser works with an operating frequency of 25.5 GHz. The working frequencies of the individual components of this fill-level measuring device are 25.5 GHz, 12.75 GHz, 750 MHz or 1.5 GHz, 300 MHz and 140 kHz.

Especially with increasing frequencies, reflections occur in the connecting lines between the individual components. Dependent on the radar measuring principle utilized (pulse radar, modulated continuous wave radar (so-called FMCW), Doppler radar, etc.), the reflections can influence accuracy of measurement, measurement linearity, resolution and maximum measured distance. Moreover, in the case of pulsed signals, the pulse shapes are influenced by reflections. From this there results in the case of a defined pulse width of the transmitted signal pulses a greater pulse width, which can interfere with the neighboring signal pulse. The interfering of a signal pulse with a neighboring signal pulse influences measurement error, which becomes more noticeable with greater distances between transmitter and receiver of the signal pulses.

There are methods for reducing reflections in connecting lines between two components of a high-frequency apparatus. In radar systems for fill level measurement, usually the line impedance of two connected components is fixed, in each case, at 50 ohm. In such case, only the ohmic resistances and not the reactances of the components are considered.

If two components are connected with one another by means of a corresponding connecting line, purely theoretically, no reflection occurs, because of the equal ohmic resistances of the two components. In the real case, however, components always have a reactance, which must be taken into consideration for preventing reflections in the connecting line.

This taking into consideration is accomplished in the method of impedance matching. In such case, the impedance of the first component is set equal to the complex conjugated impedance of the second component. The impedances are complex valued and are composed of a real- and an imaginary part, which are both frequency dependent. The imaginary part represents, in such case, the travel time of a reflection at the respectively considered frequency. By impedance matching, reflections between two components are optimally suppressed. Problematic here are, for example, tolerances of components and component inaccuracies in batch production.

The method of impedance matching is suitable not only for the given operating, respectively working, frequencies, but, instead, also for neighboring frequencies. In this way, a frequency band results, for which the impedance matching approximately holds. Especially, radar devices working according to the frequency modulated continuous wave principle (FMCW) have a frequency band. Pulse radar devices have a frequency band with a center frequency, wherein the highest power density is at the center frequency. Frequencies around the center frequency must, consequently, especially be taken into consideration, in order to achieve impedance matching for the entire frequency band.

Impedance matching can be implemented by means of adapting structures placed on the connecting line. If an impedance matching is to be approximately true for an entire frequency band, this leads to adapting structures on the connecting line, which in the total frequency band transmit the signal pulses with a uniform group travel time. In this way, dispersion effects are prevented in the signal pulses. In the case of the application of a continuous wave signal (FMCW), this plays only a lesser role.

Known from the state of the art is a method for lessening reflections, in the case of which a damping mat is adhered to a circuit board integrated, high-frequency, connecting line. Such damping mats are offered under the mark "Eccosorb". More recently, materials with similar properties are also available in the form of paste. A disadvantage of a damping mat is undesired signal loss. This is especially disadvantageous in the case of 4-20 mA devices. Furthermore, there is in the case of pulse radar systems an upper limit for the attenuation according to the correlation principle (so-called dynamic range), which shows on the correlator as increased noise level and lessened amplitude of the wanted echo. Furthermore, most components have a number of level states, each having a different impedance.

SUMMARY OF THE INVENTION

An object of the invention is to prevent reflections in a connecting line for as many level states of the components as possible, in order to obtain an as broadbanded frequency band as possible without mentionable power loss.

The object of the invention resides in a method for optimizing impedance of a connecting element between a first component and a second component of a high-frequency apparatus, especially a field device, wherein the first component and the second component have at least two level states, wherein the connecting element has an input impedance and an output impedance, wherein the first component has respective impedances in each of the at least two level states, wherein the second component has respective impedances in each of the at least two level states, comprising steps as follows: determining a respective magnitude of a difference of the first component between the complex conjugated input impedance and a respective impedance of the first component, determining a respective magnitude of a difference of the second component between the complex conjugated output impedance and a respective impedance of the second component, and simultaneously minimizing the respective magnitudes of the differences of the first and second components relative to the in- and output impedances of the connecting element.

According to the invention, the object is achieved by optimizing the input- and output impedances of the connecting element simultaneously for the impedances of the first and second components for all level states, instead of only for the impedances of the first and the second components in one level state.

In an advantageous further development, the respective magnitudes are weighted before the simultaneous minimizing. By weighting, the level states, which occur most frequently or consume the most energy or have a broadbanded frequency band, contribute more strongly to the determining of the impedance of the connecting element.

In an advantageous variant, at least one of the respective magnitudes of the differences, which exerts no influence on the optimizing of the input- and output impedances of the connecting element, is weighted with zero. In this way, level states, which play no role in the calculating of the impedance of the connecting element, are not taken into consideration for determining the impedance of the connecting element.

In an advantageous embodiment, the weighting of the at least one of the respective magnitudes of the differences is determined based on the weighting of the input power and/or the input voltage and/or the input electrical current of the first or second component. Input power and/or input voltage and/or input electrical current of each component are taken into consideration for determining the impedance of the respective component. In case a weighting of these variables can be ascertained empirically or by simulation, these weightings can be transferred to the weighting of the impedance of the connecting element.

An object of the invention is likewise achieved by a connecting element for optimizing impedance between a first component (E1) and a second component of a high-frequency apparatus, especially a field device, wherein the first and second components have at least two level states, wherein the connecting element has an input impedance and an output impedance, wherein the first component has respective impedances in each of the at least two level states, wherein the second component has respective impedances in each of the at least two level states, wherein a magnitude of a difference of the first component between a complex conjugated input impedance and a respective impedance of the first component and a magnitude of a difference of the second component between a complex conjugated output impedance and a respective impedance of the second component are simultaneously minimized.

A connecting element produced by means of the method of the invention can likewise be used for preventing reflections between two components.

In an advantageous further development, the connecting element includes an adapting structure, which has input- and output impedances, wherein the magnitudes of the first component and the magnitudes of the second component are optimized relative to the input- and output impedances. In this way, it is not necessary to replace the connecting element completely. The adapting structure is simply connected to the connecting element.

In an advantageous embodiment, the connecting element is embodied as an electrical connecting line.

In an advantageous further development, the connecting element comprises at least one resistor and/or at least one capacitor and/or at least one coil.

BRIEF DESCRIPTION OF THE DRAWINGS

The invention will now be explained in greater detail based on the appended drawing, the figures of which show as follows.

DETAILED DESCRIPTION IN CONJUNCTION WITH THE DRAWINGS

Figure 1:
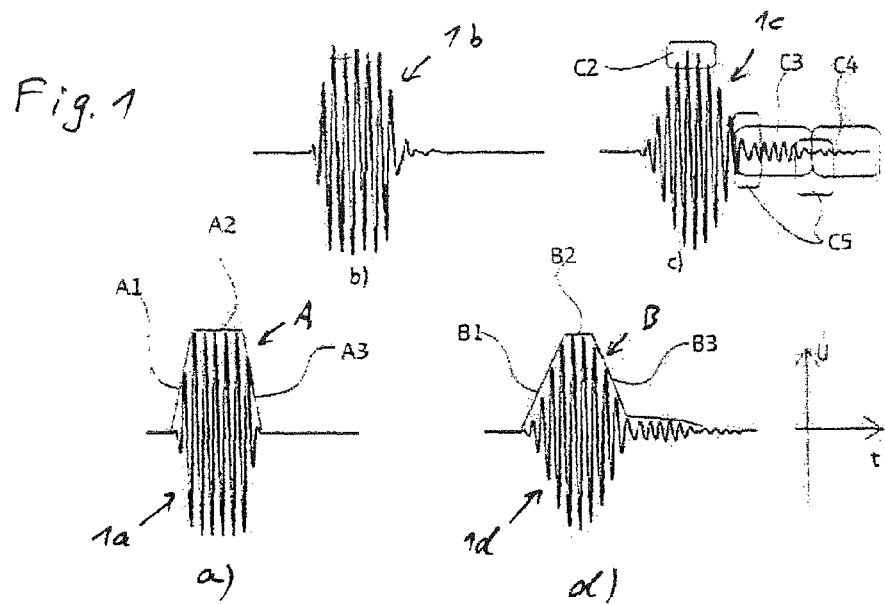
FIGS. 1a-1d four different signal pulses according to the state of the art, wherein the pulses are shown by plotting voltage as a function of time, and wherein the pulses are passed between different components of a field device.

FIGS. 1 a-d show signal pulses according to the state of the art, which are transferred within a field device between its different components. If a signal is pulsed, the signal pulse is composed of a superpositioning of a plurality of oscillations. The individual signal pulse can be enveloped by a curve, which ideally has the shape of a Gauss curve.

FIG. 1a shows an originated first signal pulse 1a, whose first envelope curve A has a first rising edge A1, a first region with a horizontal portion A2 and a first falling edge A3.

FIG. 1b shows a second signal pulse 1b, which has traveled through at least one component and now deviates slightly compared with the originated signal pulse 1a of FIG. 1a.

FIG. 1c shows a third signal pulse 1c, which has traveled through a number of components and has marked differences compared with the originated signal pulse 1a of FIG. 1a. The third signal pulse 1c includes a shortened amplitude C2, reflections C3, multiple reflections C4 and beats C5.

FIG. 1d shows a fourth signal pulse 1d corresponding to the signal pulse 1c in FIG. 1c with a second envelope curve B, which envelops the signal pulse 1d. Envelope curve B includes a second rising edge B1, a second region with a horizontal portion B2 and a second falling edge B3. The second rising and falling edges B1, B3 are flatter than the first rising and falling edges A1, A3 in the case of the signal pulse 1a of FIG. 1a. Accordingly, the second region with horizontal portion B2 is shorter than the first region with horizontal portion A2 of the signal pulse 1a of FIG. 1a. These changes, which a signal pulse suffers after passing through the components, are, for the most part, attributable to reflections occurring in connecting lines.

Figure 2:
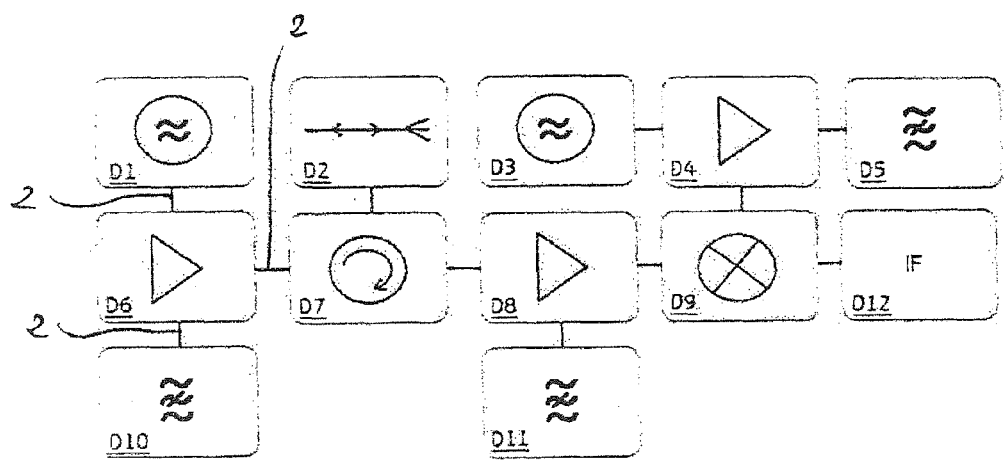
FIG. 2 a schematic circuit diagram of a field device according to the state of the art with twelve components D1-D12.

FIG. 2 shows a schematic circuit diagram of a field device according to the state of the art with twelve components D1-D12 and their connecting lines 2. The electronic components D1-D12 are implemented in the device series Micropilot ES FMR 5x of the enterprise, Endress+Hauser. The electronic high-frequency components D1-D12 are embodied either as active or passive components. The passive components are, for example, the filters D5, D10, D11, the antenna D2 and subcomponents serving as bias (voltage- or electrical current supply) within the oscillators D1, D3 or the amplifiers D4, D6, D8. Active components are, for example, the oscillators D1, D3 and the amplifiers D4, D6, D8 as well as the mixer D9.

Reflections can occur especially between oscillators D1 and D3, between each two of the amplifiers D4, D6 and D8 and between the mixer D9 and the intermediate frequency stage D12. The reaction of the intermediate frequency stage D12 to the mixer D9 is very small due to the large frequency- and impedance difference, but was detected and should, consequently, be heeded. Furthermore, reflections can occur between each two of the components, such as, for example, the transmitting-receiving separator or directional coupler, D7, the mixer D9, the antenna D2, as well as the filters and their bias D5, D10, D11.

Figure 3:
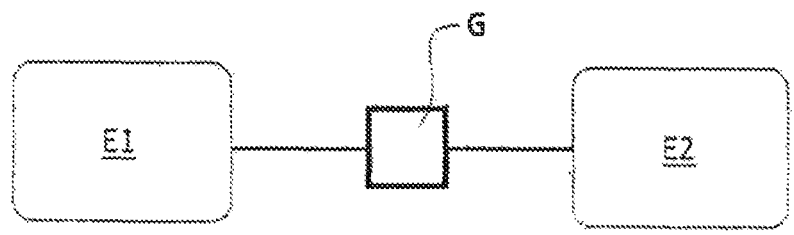
FIG. 3 two components according to the state of the art, which are connected with one another by means of a connecting line, wherein the connecting line includes a damping mat.

FIG. 3 shows schematically a damping mat G according to the state of the art situated between two arbitrary components E1 and E2 according to the state of the art. Damping mat G lessens the reflections in circuit board integrated, high-frequency, connecting lines. For this, the damping mat G is adhered to the connecting line 2 or applied in the form of a paste on the connecting line 2. Disadvantageous in the case of such damping mats G is the high signal loss. The degree of attenuation corresponds about to the attenuation of the transmitted signal pulse.

Figure 4:
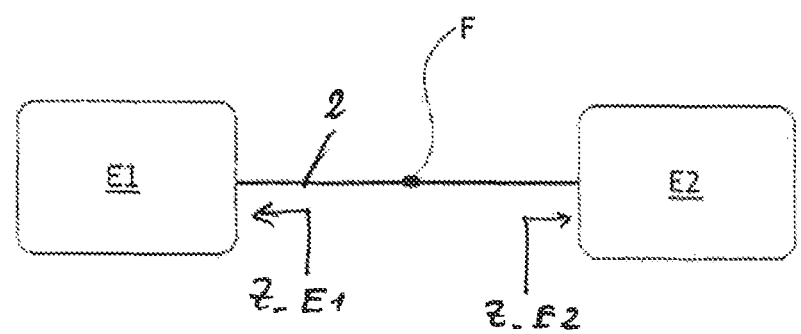
FIG. 4 two arbitrary components according to the state of the art, connected with one another by means of a connecting line with a point F, from which impedances of the components are considered.

FIG. 4 shows two arbitrary components E1, E2 of the field device, which are electrically connected by means of a connecting line 2. Considered from an arbitrary point F on the connecting line 2 are a first impedance Z_E1 and a second impedance Z_E2 of the first and second components E1, E2. Impedance matching at the point F results from $$Z\_E1 = Z\_E2^*, \quad \text{Eq1}$$

wherein $Z\_E2^*$ is the complex conjugated impedance of Z_E2. From Eq1 there follows $$ReZ\_E1 = ReZ\_E2 \text{ and } ImZ\_E1 = -ImZ\_E2 \quad \text{Eq2}$$

Since the equations Eq1 and Eq2 are solvable only for a single frequency and not for a frequency band, the equations must be considered approximately. The approximation equations are $$ReZ\_E1 \approx ReZ\_E2 \text{ and } ImZ\_E1 \approx -ImZ\_E2 \quad \text{Eq3}$$

Figure 5:
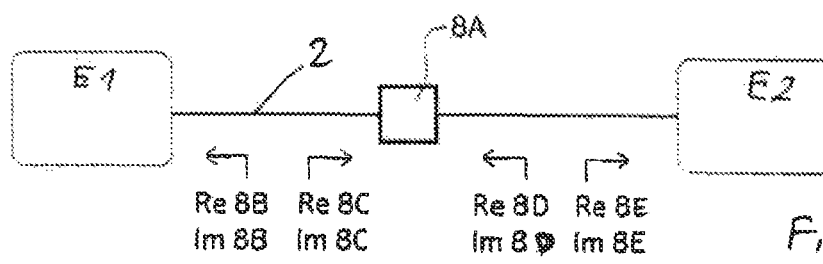
FIG. 5 two arbitrary components, which are connected with one another by means of a connecting line, wherein the connecting line has an adapting structure.

FIG. 5 shows the first and second components E1, E2 with a connecting line 2, which has an adapting structure 8A. Adapting structure 8A has an input- and an output impedance 8C and 8D. The first component E1 has a first impedance 8B and the second component E2 has a second impedance 8E. If the first and second components E1, E2 have a number of level states Z1, Z2, . . . , there results for the first and second components E1, E2 for each level state Z1, Z2, . . . , in each case, an impedance 8B_1, 8B_2, . . . of the first component E1 and an impedance 8E_1, 8E_2, . . . of the second component E2, wherein the respective impedances 8B_1, 8B_2, . . . , respectively 8E_1, 8E_2, . . . of the first and second components E1, E2 are known. For an impedance matching of the adapting structure 8A to the first and second impedances 8B, 8E, the input- and output impedances 8C and 8D of the adapting structure 8A must be matched respectively to the first and second impedances 8B and 8E of the first and second components E1, E2. For this, all impedances 8B, 8C, 8D and 8E are considered in the Gauss plane, since they are complex valued. In the Gauss plane, the impedances 8B, 8C, 8D and 8E refer, in each case, to a point, which is established by the real- and imaginary parts of the impedances. For example, for 8B:

$$8B = Re8B + Im8B \quad \text{Eq4}$$

If the adapting structure 8A is connected with the first and second components E1, E2 in such a way that the input impedance 8C of the adapting structure 8A is connected to the first component E1 and the output impedance 8D of the adapting structure 8A is connected to the second component E2, then, according to the impedance matching Eq1, $$8B = 8C^* \text{ and } 8D^* = 8E \quad \text{Eq5}$$

must be fulfilled simultaneously, wherein 8D* is the complex conjugated input impedance 8C of the adapting structure 8A and 8D* is the complex conjugated output impedance 8D of the adapting structure 8A. This means that the separation TA1 of the two points 8B and 8C* and the separation TA2 of the two points 8 D* and 8E must be simultaneously zero in the Gauss plane.

The difference ΔTA1 between the impedance 8B of the first component E1 and the complex conjugated input impedance 8C* of the adapting structure 8A amounts to:

$$\Delta TA1 = (Re8B - Re8C) + (Im8B + Im8C) \quad \text{Eq6}$$

The magnitude TA1 of the difference ΔTA1 amounts to $$TA1 = \sqrt{[Re8B - Re8C]^2 + [Im8B + Im8C]^2} \quad \text{Eq7}$$

The magnitude TA1 is exactly the separation of the two points 8B and 8C* in the Gauss plane. Analogously, the separation TA2 between the two points 8D and 8E* in the Gauss plane amounts to:

$$TA2 = \sqrt{[Re8D - Re8E]^2 + [Im8D + Im8E]^2} \quad \text{Eq8}$$

In order to minimize the magnitudes TA1 and TA2 simultaneously, the sum TA of the two magnitudes TA1 and TA2 can be minimized:

$$TA = TA1 + TA2 \quad \text{Eq 9}$$

$$= \sqrt{[Re8B - Re8C]^2 + [Im8B + Im8C]^2} +$$
$$\sqrt{[Re8D - Re8E]^2 + [Im8D + Im8E]^2}$$

If the first and second components E1, E2 have, for example, four level states Z1-Z4, the input- and output impedances 8C and 8D of the adapting structure 8A must be matched for all level states Z1-Z4 to the first and second impedances 8B and 8E of the first, respectively second component E1, E2. Thus, there results for the magnitudes TA1 and TA2: TA1_1, TA1_2, . . . , respectively TA2_1, TA2_2, . . . for all level states Z1-Z4. For the total magnitude of all magnitudes TA1_1, TA1_2, . . . , respectively TA2_1, TA2_2, . . . for all level states Z1-Z4, there results:

$$TM = \sqrt{[Re8B\_9 - Re8C]^2 + [Im8B\_9 + Im8C]^2} + \quad \text{Eq 10}$$
$$\sqrt{[Re8D - Re8E\_9]^2 + [Im8D + Im8E\_9]^2} +$$
$$\sqrt{[Re8B\_10 - Re8C]^2 + [Im8B\_10 + Im8C]^2} +$$
$$\sqrt{[Re8D - Re8E\_10]^2 + [Im8D + Im8E\_10]^2} +$$
$$\sqrt{[Re8B\_11 - Re8C]^2 + [Im8B\_11 + Im8C]^2} +$$
$$\sqrt{[Re8D - Re8E\_11]^2 + [Im8D + Im8E\_11]^2} +$$
$$\sqrt{[Re8B\_12 - Re8C]^2 + [Im8B\_12 + Im8C]^2} +$$
$$\sqrt{[Re8D - Re8E\_12]^2 + [Im8D + Im8E\_12]^2}$$

The total magnitude TM is to be minimized relative to the variables 8C and 8D. The magnitudes TA1 and TA2 can, in each case, only be positive or 0, i.e. an optimizing of an individual magnitude TA1, TA2, . . . in the extreme to the detriment of another magnitude is not possible. The in- and output impedances 8C and 8D of the adapting structure 8A, in the case of which the total magnitude TM is minimum, are the optimum values, in order to obtain a matching of the adapting structure 8A to all level states of the first and second components E1, E2.

Some level states should be advantaged or disadvantaged relative to the other level states. This results from the fact that some level states occur more frequently or less frequently than other level states or that some level states require more power or less power than other level states. For these reasons, it makes sense to weight the magnitudes of the differences of the respective level states.

For illustrating the method for weighting, the level states Z1-Z4 of the component D9 (mixer) are considered. It is for simplification that only 4 level states Z1-Z4 are considered. In each level state Z1-Z4, the component D9 (mixer) has a first input power P_in (D8) and a second input power P_in (D4), wherein the first input power P_in (D8) comes from the component D8 and the second input power P_in (D4) comes from the component D4. On the basis of experience, a certain weighting is selected for each level state Z1-Z4 corresponding to the first and second input powers P_in (D8) and P_in (D4). The level states Z1-Z4, the first and second input powers P_in (D8) and P_in (D4) and the respective weightings are shown for the component D9 in the Table T1.

TABLE T1

The level states of the component D9 (mixer)

| level state. | P_in (D4) | P_in (D8) | wt | description |
|---|---|---|---|---|
| Z1 | 0 W | 0 W | 0 | components offline |
| Z2 | High | 0 W | ⅓ | mixer-driver without signal |
| Z3 | 0 W | High | ⅓ | signal without mixer driver |
| Z4 | High | High | ⅓ | signal and mixer driver |

The component D4, which is embodied as an amplifier, is located neighboring the component D9. Corresponding to the Table T1 of the component D9, a Table T2 can be derived for the component D4. For simplification, three level states Z5-Z7 are considered for the component D4.

TABLE T2

Simplified level states of the component D4

| level state | P_out (D9) | I_out (D5) | wt | description |
|---|---|---|---|---|
| Z5 | 0 W | 0 A | 0 | no signal –> no reflection |
| Z6 | 0 W | High | ½ | amplifier without output power |
| Z7 | High | High | ½ | amplifier with output power |

In such case, P_out (D9) is an output power of the component D4, which goes to the component D9 and I_out (D5) is the output current of the component D4, which goes to the component D5.

Tables T1 and T2 will now be linked with one another. The linking occurs in the following way: The column of the first input power P_in (D8) of the Table T1 and the column of the output electrical current I_out (D5) of the Table T2 have no influence on the connecting line 2 between the components D4 and D9 and are, consequently, not taken into consideration for the linking. Only the column with the second input power P_in (D4) of Table T1 and the column output power P_out (D9) of Table T2 are taken into consideration for linking Tables T1 and T2.

In order to link the weightings of the Tables T1 and T2, all combinations {P_in (D4), P_out (D9)} of the first input power P_in (D4) and the output power P_out (D9) are considered. Four combinations result: {0, 0}; {0, high}; {high, 0}; {high, high}. The combination {0, high}, for example, means, that the first input power P_in (D4)=0 and the output power P_out (D9)=high. Determinative for linking Tables T1 and T2 is how often the state, second input power P_in (D4)=0, is present, namely exactly two times (level states Z1 and Z3) and, in each case, with a weighting of ⅓. Thus, the first factor for first input power P_in (D4) for the combination (0, high) becomes: ⅓+⅓=⅔.

Decisive for the second factor is how often the state P_out (D9)=high is present, namely likewise two times (level states Z6 and Z7), once with a weighting of 0 and once with a weighting of ½. Thus, the second factor for output power P_out (D9) for the state (0, high) becomes: 0+½=½. Then, the first factor for input power P_in (D4) and the second factor for the output power P_out (D9) are multiplied to produce a total factor: ⅔*½=²⁄₆. The weighting for the combination (0, high) thus becomes ²⁄₆. This method is performed for each of the combinations {P_in (D4), P_out (D9)}={0, 0); {0, high}; {high, 0}; {high, high}, so that the following Table T3 with the corresponding weightings results.

TABLE T3

Linking Tables T1 and T2

| level state | P_in (D4) | P_out (D9) | wt ... |
|---|---|---|---|
| Z9 | high | 0 W | 2/6 |
| Z10 | 0 W | 0 W | 1/6 |
| Z11 | High | High | 2/6 |
| Z12 | 0 W | High | 0 |

Figure 6:
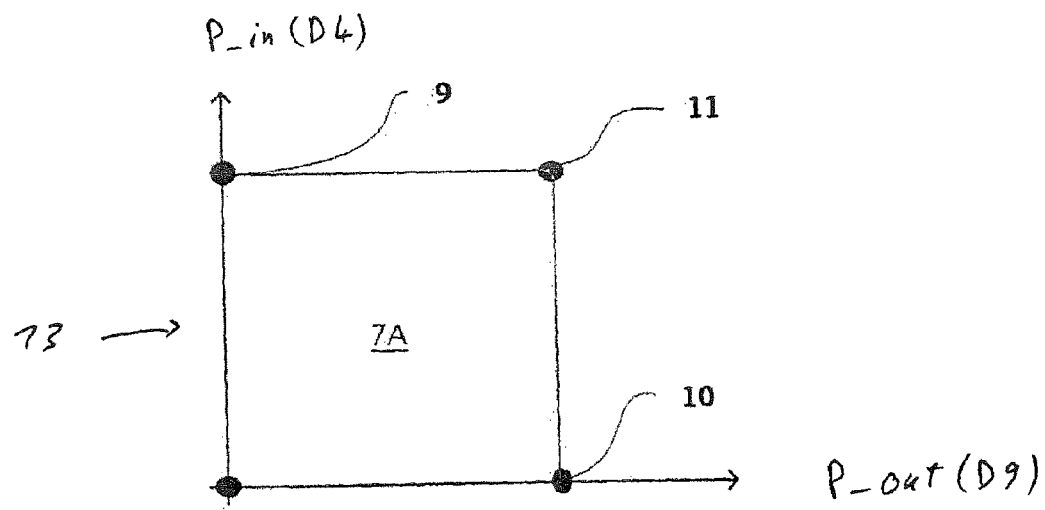
FIG. 6 a first graph, which shows input- and output powers for different level states of the amplifier.

FIG. 6 shows a first graph 13 with the first input power P_in (D4) plotted on the y-axis and the output power P_out (D9) plotted on the x-axis. Entered in this first graph 13 are the level states Z9-Z12 of Table T3. The level states Z9-Z12 define a region 7A. All level states lying between the level states Z9-Z12 come within region 7A. If the weightings are normalized to one, the following Table T4 results.

TABLE T4

Weightings of Table T3 normalized to one

| level state | P-In | P-out | wt ... | description |
|---|---|---|---|---|
| Z9 | high | 0 W | 2/5 | Eq9 (Eq5) |
| Z10 | 0 W | 0 W | 1/5 | Eq10 |
| Z11 | High | High | 2/5 | Eq11 |
| Z12 | 0 W | High | 0 | Eq12 |

The weightings ascertained in Table T4 are taken into consideration for weighting the magnitudes TA1 and TA2 of the different level states Z9-Z12, in order to determine the total magnitude TM. The weighted total magnitude TM then becomes:

$$TM = \sqrt{[Re8B\_9 - Re8C]^2 + [Im8B\_9 + Im8C]^2} +$$
$$\sqrt{[Re8D - Re8E\_9]^2 + [Im8D + Im8E\_9]^2} * 0.4 +$$
$$\left(\sqrt{[Re8B\_10 - Re8C]^2 + [Im8B\_10 + Im8C]^2} + \right.$$
$$\left.\sqrt{[Re8D - Re8E\_10]^2 + [Im8D + Im8E\_10]^2}\right) * 0.2 +$$
$$\left(\sqrt{[Re8B\_11 - Re8C]^2 + [Im8B\_11 + Im8C]^2} + \right.$$
$$\left.\sqrt{[Re8D - Re8E\_11]^2 + [Im8D + Im8E\_11]^2}\right) * 0.4 +$$
$$\left(\sqrt{[Re8B\_12 - Re8C]^2 + [Im8B\_12 + Im8C]^2} + \right.$$
$$\left.\sqrt{[Re8D - Re8E\_12]^2 + [Im8D + Im8E\_12]^2}\right) * 0.0$$

The last two magnitudes of the differences are weighted with zero, since they do not contribute to optimizing impedance of the connecting line. In order to obtain a broadbanded frequency band applied for FMCW systems instead of an individual expression $$[Re8B\_11 - Re8C]^2 + [Im8B\_11 + Im8C]^2, \quad (Eq15)$$

the linear average value of the frequency band or for pulse systems a Gauss weighting around the center frequency is applied. Also other weighting methods are possible here.

Figure 7:
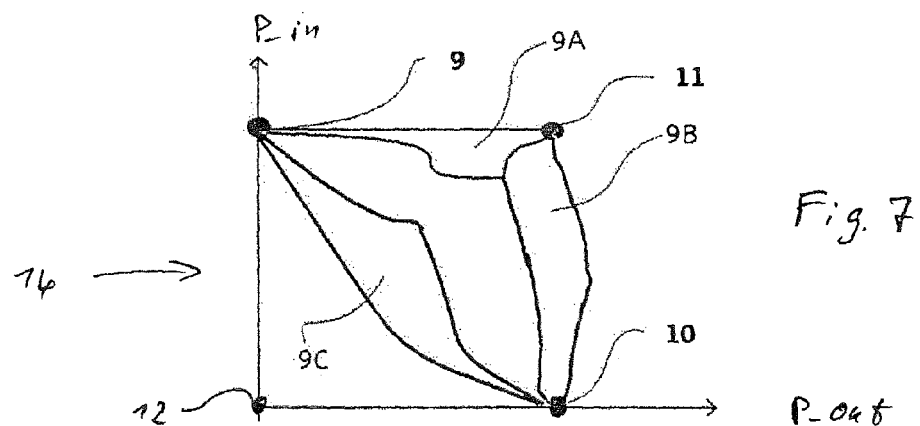
FIG. 7 a second graph, which shows input- and output powers for different level states of the amplifier, wherein the level states are weighted by means of a first weighting.

FIG. 7 shows a second graph corresponding to the first graph in FIG. 6, however, with a weighting of the magnitudes TA1 and TA2 for each level state. The weighting leads to the fact that the region 7A is subdivided into a number of smaller alternative regions 9A, 9B, 9C. In part, such as e.g. in the case of the component D9 (mixer), simulation values were replaced or supplemented by measured values.

Figure 8:
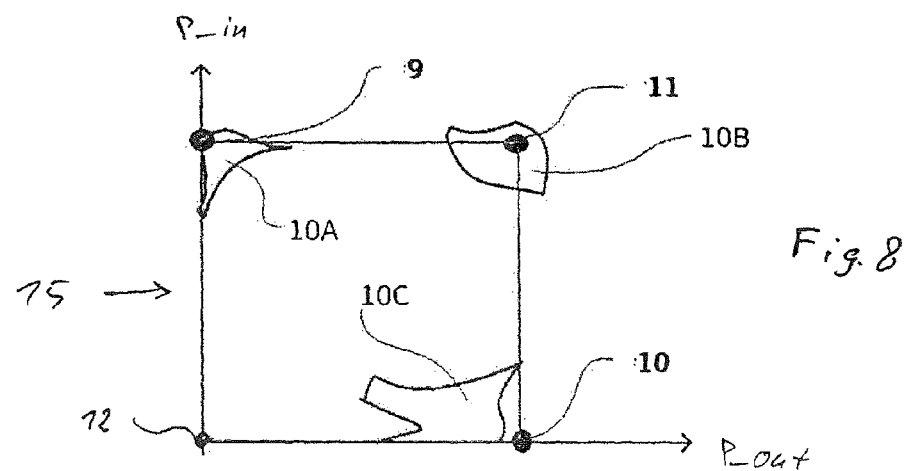
FIG. 8 a third graph, which shows input- and output powers for the different level states of the amplifier, wherein the level states are weighted by means of a second weighting.

FIG. 8 shows a third graph 15 corresponding to the first and second graphs 13, 14 in FIGS. 6 and 7. Here, the level states are represented not by points but, instead, level state regions 10A, 10B, 10C, within which points may lie. The sizes of the level state regions 10A, 10B, 10C are governed by the weighting of the respective level states.

Figure 9:
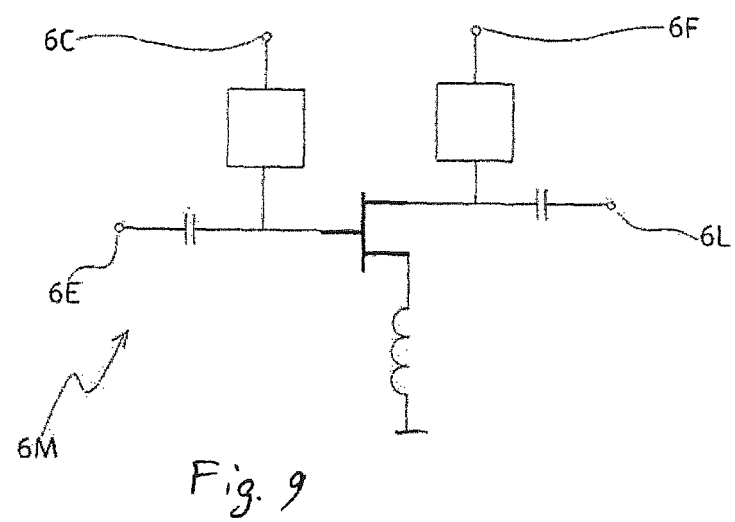
FIG. 9 a circuit of a component embodied as an amplifier.

FIG. 9 shows the circuit construction of an amplifier 6M of the field device, such as is implemented for the component D6 or D8 (see FIG. 2). As a further example, the weighting method is applied to the amplifier 6M. In the following, only the terminals of the amplifier 6M are considered. The terminals are a signal input 6E, a signal output 6L, a control voltage 6C and a supply voltage 6F.

Resulting from the operation of this amplifier 6M are five level states Z1-Z5 having, in each case, an input power P1-P5 on the signal input 6E, wherein P1=0 and P4≈P2. The control voltage 6C can assume the different values U1, U2, U3 as well as the different control electrical currents I1, I2, wherein U2=I2=0.

If one enters the level states Z1-Z5 in a column and the associated input powers P1-P5, control voltages U1-U3 and control electrical currents I1, I2 into the respective rows of the level states, the following Table T5 results for the amplifier 6M.

TABLE T5

Level states of the amplifier 6M

| level state | P (6E) | U (6C) | I (6F) | description |
|---|---|---|---|---|
| Z1 | 0 W | 0 V | 0 A | HF-system offline, no reflection |
| Z2 | P2 | U2 | 0 A | sending of pulses, no receipt |
| Z3 | P3 | U3 | I2 | receiving, no sending |
| Z4 | P2 | U3 | I2 | sending + receiving simultaneously |
| Z5 | P5 | U2 | 0 A | expecting receipt of pulses |

Based on system theoretical ideas, it makes sense to weight the individual level states Z1-Z5. The weightings of the individual level states are presented in the following Table T6.

TABLE T6

Weighted level states of the amplifier 6M

| level state | P (6E) | U (6C) | I (6F) | wt ... | description |
|---|---|---|---|---|---|
| Z1 | 0 W | 0 V | 0 A | 0% | HF-system offline, no reflection |
| Z2 | P2 | U2 | 0 A | 10% | sending of pulses, no receipt |
| Z3 | P3 | U3 | I2 | 60% | receiving, no sending |
| Z4 | P2 | U3 | I2 | 10% | sending + receiving simultaneously |
| Z5 | P5 | U2 | 0 A | 20% | expecting receipt of pulses |

In the level state Z1, too little power is present on the input terminals of the amplifier 6M to cause a disturbance brought about by reflections. For this reason, this level state is weighted with zero. The level state Z4 represents a so-called near region, in which the signal from one component can cross over to another component. For reasons of perspicuity, power on the output 6L is not given in above table. Table T6 shows, using the example of an amplifier, how the level states Z1-Z5 can be weighted.

Component D1 represents a pulse oscillator and component D6 a transmitting amplifier. The two components D1 and D6 have a different timing. For this reason, a linked Table T7 between the two components takes the following form.

TABLE T7

Linking Tables T5 and T6

| level state | U (D1) | P (D1) | U (D6) | I (D6) | wt ... | description |
|---|---|---|---|---|---|---|
| Z1 | low | 0 W | low | low | 0% | components offline |
| Z2 | low | 0 W | low | high | 10% | standby |
| Z3 | low | 0 W | high | high | 40% | amplifier, no pulse |
| Z4 | high | high | high | high | 45% | pulse is amplified |
| Z5 | low | low | high | high | 5% | post-pulse oscillator |

In such case, U (D1) is a voltage on the component D1 (oscillator), P (D1) the output power of the component D1 (oscillator), U (D6) the control voltage of the component D6 (amplifier) and I (D6) the supply electrical current of the component D6 (amplifier).

The research of this method has surprizingly shown that in the case of an HF-amplifier according to FIG. 9 a low control voltage 6C on the gate of the field effect transistor 6H leads to a smaller reaction, especially a smaller reaction to an impedance change, on the output, whereby the transmission of the amplifier from the output to the input is lessened. Furthermore, this leads to a smaller change of the phase difference on the output between turned on and turned off supply current 6F. Such a circuitry is thus also part of the present invention.

The invention claimed is:

1. A connecting element for optimizing impedance between a first component and a second component of a high-frequency apparatus, especially a field device, wherein the first component and the second component have at least two level states, comprising:
   an input impedance and an output impedance, wherein:
   said first component has respective impedances in each of the at least two level states,
   said second component has respective impedances in each of the at least two level states;
   a magnitude of a difference of said first component between a complex conjugated input impedance and a respective impedance of said first component and a magnitude of a difference of said second component between a complex conjugated output impedance and a respective impedance of said second component are simultaneously minimized.

2. The connecting element as claimed in claim 1, wherein:
   said connecting element includes an adapting structure, which has input- and output impedances;
   the magnitudes of the first component and the magnitudes of the second component are optimized relative to the input- and output impedances.

3. The connecting element as claimed in claim 1, wherein:
   said connecting element is embodied as an electrical connecting line.

4. The connecting element as claimed in claim 1, wherein:
   said connecting element comprises at least one resistor and/or at least one capacitor and/or at least one coil.

5. A method for optimizing impedance of a connecting element between a first component and a second component of a high-frequency apparatus, especially a field device, wherein the first component and the second component have at least two level states, the connecting element has an input impedance and an output impedance, and the first component has respective impedances in each of the at least two level states, and the second component has respective impedances in each of the at least two level states, the method comprising steps as follows:
   determining a respective magnitude of a difference of the first component between the complex conjugated input impedance and a respective impedance of the first component;
   determining a respective magnitude of a difference of the second component between the complex conjugated output impedance and a respective impedance of the second component; and
   simultaneously minimizing the respective magnitudes of the first component and second component relative to the in- and output impedances of the connecting element.

6. The method as claimed in claim 5, wherein:
   the respective magnitudes are weighted before the simultaneous minimizing.

7. The method as claimed in claim 6, wherein:
   at least one of the respective magnitudes, which exerts no influence on the optimizing of the input- and output impedances of the connecting element, is weighted with zero.

8. The method as claimed in claim 6, wherein:
   the weighting of the at least one of the respective magnitudes is determined based on the weighting of the input power and/or the input voltage and/or the input electrical current of the first or second component.

* * * * *